(12) United States Patent
Ouellette et al.

(10) Patent No.: US 10,490,296 B2
(45) Date of Patent: Nov. 26, 2019

(54) MEMORY BUILT-IN SELF-TEST (MBIST) TEST TIME REDUCTION

(71) Applicant: GLOBALFOUNDRIES INC., Grand Cayman (KY)

(72) Inventors: Michael R. Ouellette, Westford, VT (US); Deepak I. Hanagandi, Bangalore (IN); Aravindan J. Busi, Bangalore (IN); Kiran K. Narayan, Hyderabad (IN); Michael A. Ziegerhofer, Jeffersonville, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 82 days.

(21) Appl. No.: 15/019,590

(22) Filed: Feb. 9, 2016

(65) Prior Publication Data
US 2017/0229191 A1   Aug. 10, 2017

(51) Int. Cl.
*G11C 29/44* (2006.01)
*G11C 29/36* (2006.01)

(52) U.S. Cl.
CPC ........... *G11C 29/44* (2013.01); *G11C 29/36* (2013.01); *G11C 2029/3602* (2013.01)

(58) Field of Classification Search
CPC ...... G11C 29/44; G11C 29/36; G11C 29/3602
See application file for complete search history.

(56) References Cited

U.S. PATENT DOCUMENTS

| | | | |
|---|---|---|---|
| 6,615,378 B1 | 9/2003 | Dwork | |
| 8,280,687 B2 | 10/2012 | Cheng et al. | |
| 9,881,694 B2 | 1/2018 | Busi et al. | |
| 2002/0157051 A1* | 10/2002 | Eckelman | G06F 11/263 714/736 |
| 2004/0233767 A1* | 11/2004 | Wu | G11C 29/56 365/232 |
| 2005/0172180 A1* | 8/2005 | Damodaran | G11C 29/16 714/723 |
| 2008/0133994 A1* | 6/2008 | Oh | G06F 11/1008 714/746 |
| 2011/0239064 A1* | 9/2011 | Byom | G06F 11/1048 714/723 |
| 2012/0230136 A1* | 9/2012 | Gorman | G11C 29/4401 365/200 |
| 2017/0018313 A1* | 1/2017 | Busi | G11C 29/38 |

FOREIGN PATENT DOCUMENTS

WO    2009039316 A2    3/2009

OTHER PUBLICATIONS

Su et al., "A Built-in Self-Diagnosis and Repair Design With Fail Pattern Identification for Memories", IEEE Transactions on Very Large Scale Integration (VLSI) Systems (vol. 19, Issue: 12, pp. 2184-2194), Dec. 2011.*

* cited by examiner

*Primary Examiner* — April Y Blair
*Assistant Examiner* — Rong Tang
(74) *Attorney, Agent, or Firm* — Anthony Canale; Andrew M. Calderon; Roberts Mlotkowski Safran Cole & Calderon, P.C.

(57) ABSTRACT

Approaches for a memory built-in self-test (MBIST) are provided. The MBIST circuit includes a fail status register which receives a new fail signal value in response to a detection of a unique fail in a pattern, and a pattern mask register which stores at an end of the pattern a different value of the new fail signal value representative of the unique fail.

20 Claims, 5 Drawing Sheets

MEMORY BUILT-IN SELF-TEST (MBIST) TEST TIME REDUCTION

FIELD OF THE INVENTION

The present disclosure relates to a memory built-in self-test (MBIST) test time reduction and, more particularly, to a MBIST test time reduction which uses per pattern fail information.

BACKGROUND

Memory built-in self-test (MBIST) is an important tool for testing memories (including finding/diagnosing and repairing defects within those memories). As more memory is integrated into chips, thorough BIST test and repair is a requirement in order to ensure reasonable product quality/reliability levels. To improve MBIST quality oftentimes more test patterns are run as part of a manufacturing test. Total test time can take many millions of cycles when all necessary test patterns are included.

During the manufacturing test, a plurality of memory is tested using a single BIST engine. BIST engines may run into two different modes of operations: repair mode and pass-fail mode. Repair mode repairs the plurality of memory by swapping the failed locations with the redundant elements and the redundancy solution gets enabled at the end of the repair mode. Pass-fail mode qualifies the plurality of memory after the redundancies are enabled.

Each kind of memory has certain set of patterns, with each pattern targeted to find unique faults present in the memory during the manufacturing test. Typically, all of the patterns are executed twice; once during the repair mode and then once during the pass-fail mode. In the repair mode, if a fail is detected during the execution of a pattern, the fail information is collected by the repair logic and if the fail is unique, the failing information is passed to the MBIST. If more fails are detected in any of the subsequent patterns, all of the unique fail information is sent to the BIST engine. At the end of the repair mode, the BIST engine has all of the information regarding which patterns failed, and specifically which patterns exhibited a unique fail.

In view of the above, test time can be saved by determining which patterns had unique fails in the repair mode and then programming the BIST to only run those patterns in the pass-fail mode, instead of running all patterns in the pass-fail mode. Alternatively, a bit-fail mapping procedure could be used to understand which patterns failed uniquely, but this would require much more test time. Specifically, a bit-map failing of the failing memory can occur by rotating all of the failing information and logging this data to a tester. The tester could then analyze the data, and program all the MBIST's pattern registers present in the chip. Logging fail data to the tester is intensively time consuming and it would take a prohibitively large amount of tester time to accomplish this task.

SUMMARY

In a first aspect of the disclosure, there is a memory built-in self-test (MBIST) circuit including a fail status register which receives a new fail signal value in response to a detection of a unique fail in a pattern, and a pattern mask register which stores at an end of the pattern a different value of the new fail signal value representative of the unique fail.

In another aspect of the disclosure, there is a method including executing a plurality of patterns in at least one memory device, detecting a unique fail in a pattern during execution of the plurality of patterns, and changing a bit value in a pattern mask register which corresponds with the detected unique fail.

In another aspect of the disclosure, there is a method including executing a first plurality of patterns in at least one memory device to detect a second plurality of patterns which have a unique fail, and executing the second plurality of patterns which have the unique fail. The second plurality of patterns is a subset of the first plurality of patterns.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to a memory built-in self-test (MBIST) test time reduction and, more particularly, to a MBIST test time reduction method and apparatus which uses per pattern fail information. In the present disclosure, the pass/fail patterns are reduced after repair to just those patterns that generated repairs. Patterns that do not generate repairs do not need pass/fail coverage. The present disclosure adds logic to mask the pass/fail tests based on the repair test results. In addition, the present disclosure incorporates by reference application Ser. No. 14/800,067, which is hereby incorporated herein by reference in its entirety.

The BIST engine of the present disclosure contains a pattern mask register, where each bit of the pattern mask register corresponds to a pattern in the pattern suite. When a bit corresponding to a particular pattern is programmed to "1" in the pattern mask register, the pattern is "masked" and is skipped during the BIST execution. When a unique fail is reported during the execution of a pattern during the repair mode, the pattern mask register is re-used to capture the fail information and to reset the pattern mask register to "0". During the execution of a pattern, if a fail is detected, then a single bit fail status register is set to "1", and at the end of the pattern, the inversion of the bit fail status register value, a "0" in the case of a fail, is written to the particular bit in the pattern mask register corresponding to the current pattern. Thus, the pattern mask register bits are re-used to capture the fail information.

In embodiments, repair logic collects failing row and column information of a memory, and determines whether the failure is a new fail or a fail which has been reported and fixed by the previously run patterns. If the failure is a new cell failure for a given pattern, repair logic sends out this information to the BIST. Based on this fail information, the pattern mask register's corresponding bits can be masked or unmasked.

Memory redundancy comes out in two flavors: "column only redundancy" and "row and column redundancy". For example, row and column redundancy may be implemented as 4 redundant rows and 2 redundant columns. In the worst case scenario or this example, there could not be more than 6 fails present to have a workable memory. For memories having row and column redundancy, to have better yield for memories, the number of fails seen will typically be between 0 and 4. If multiple fails are from a few different patterns, then it would be necessary to run only those failing patterns in the pass-fail mode.

In some systems, high MBIST run time occurs because all patterns are run twice (once during repair mode and once during pass fail mode). In the MBIST of the present disclosure, existing resources are used to accomplish a test-time reduction. In the present disclosure, identifying and masking of non-failing patterns during pass fail mode saves a lot of test time. Further, there is no involvement of a tester with regards to collecting the information related to the failing memory. Also, in the present disclosure, the MBIST engine uses a pattern mask register to define what patterns to run. Thus, there is no overhead in test-time required for reprogramming the pattern register during the execution of the MBIST in the repair mode and the pass-fail mode because everything is updated in real time (e.g., on the fly). Also, in the MBIST of the present disclosure, statistics of failing patterns can be identified to enhance tracking and testing (e.g., characterizing memories to identify patterns that need to be run in a test suite).

Figure 1:
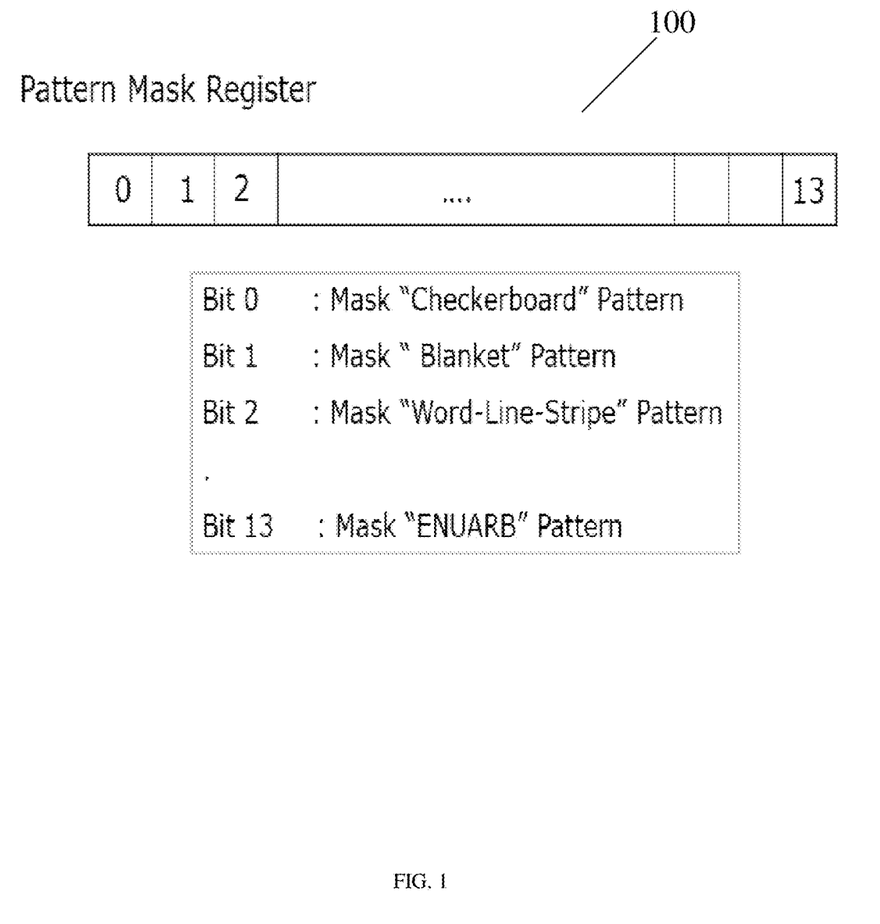
FIG. 1 shows an illustrative, non-limiting example of a pattern mask register in accordance with aspects of the disclosure.

FIG. 1 shows an illustrative, non-limiting example of a pattern mask register in accordance with aspects of the disclosure. In particular, FIG. 1 shows an example of a pattern mask register 100. In the pattern mask register 100, each bit corresponds to a pattern in a pattern suite. Further, in the pattern mask register 100, pattern bits that are set to "1" will cause the corresponding patterns to not run during BIST operation.

In FIG. 1, the pattern mask register 100 has 14 different patterns targeting different kind of faults present in the memory. However, the pattern mask register 100 is not limited to 14 different patterns, and other number of patterns (e.g., 25 different patterns) is contemplated by the present disclosure. In FIG. 1, any bit in the pattern mask register 100 set to "1" is masked, and the corresponding patterns are skipped during the BIST execution. In the illustrative, non-limiting example of the pattern mask register 100 in FIG. 1, bit 0 corresponds to a "checkerboard" pattern, bit 1 corresponds to a "blanket" pattern, bit 2 corresponds to a "word-line-stripe" pattern, and bit 13 corresponds to a "ENUARB" pattern.

Figure 2:
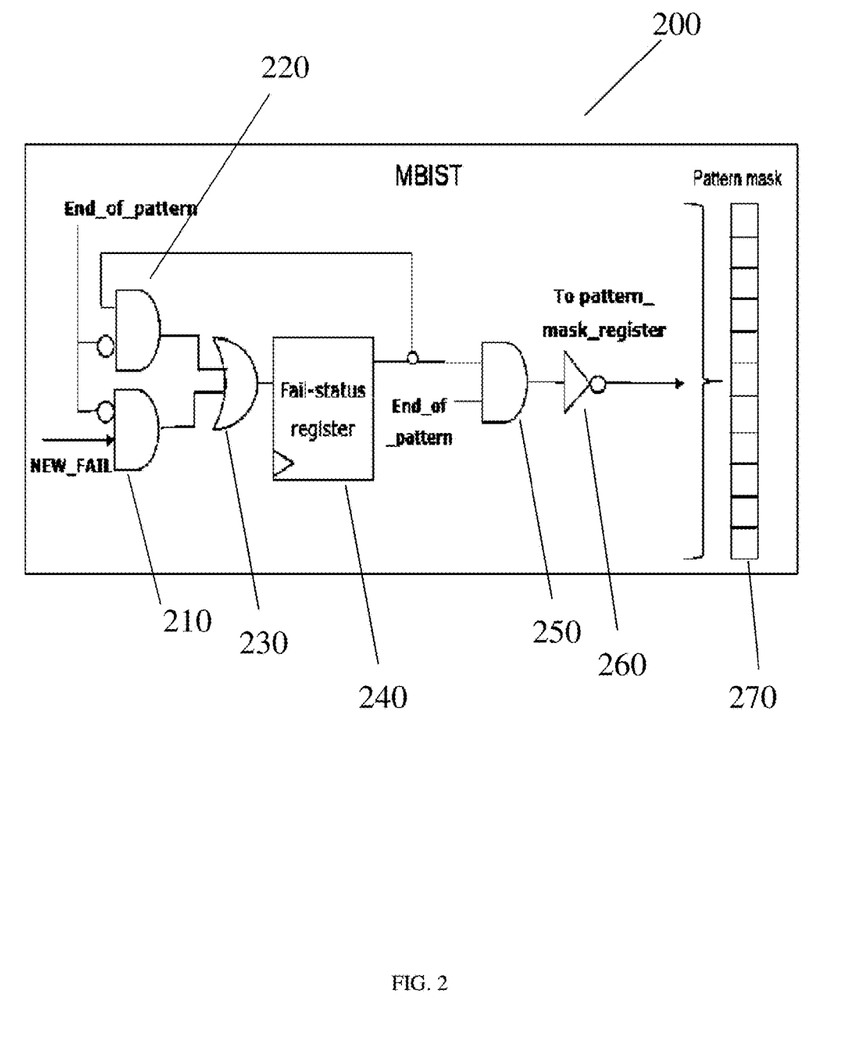
FIG. 2 shows a memory built-in self-test (MBIST) which implements processes in accordance with aspects of the disclosure.

FIG. 2 shows a memory built-in self-test (MBIST) which implements processes in accordance with aspects of the disclosure. The MBIST 200 includes AND gate 210, AND gate 220, OR gate 230, a fail-status register 240, AND gate 250, a NOT gate 260, and a pattern mask register 270. The MBIST 200 also includes other logic components which are not part of this invention and therefore are not shown in FIG. 2. In FIG. 2, a single bit "fail status" acts as a sticky latch to register new_fail signal for a given pattern in the fail-status register 240.

The fail-status register 240 is initialized to "0" at the beginning of the MBIST run. Then, a new_fail signal from repair logic enables the fail-status register 240 to "1". At the end of the pattern, if there is a unique fail that has been captured, then the bit within the pattern mask register 270 that corresponds to the ending pattern gets reset to a "0". This causes that pattern to not be masked on a subsequent MBIST run (i.e., the pattern will automatically be unmasked and the pattern will be run during the pass-fail mode). However, if there is no unique fail, then the bit within the pattern mask register 270 that corresponds to the ending pattern gets set to a "1". This causes that pattern to be masked on a subsequent MBIST run (i.e., the pattern will automatically be masked and the pattern will not be run during the pass-fail mode). The fail-status register 240 resets to "0" just before executing the next pattern.

In FIG. 2, a pattern mask register 270 is re-used to mask the non-failing patterns (i.e., updating the respective bit to "1"). The automatically programmed pattern mask register 270 is re-used in the pass-fail mode. The non-failing patterns will not be re-run during pass-fail mode and thus save test time. FIG. 2 also ensures that the pattern mask register 270 is updated only if a unique fail or "new fail" is seen in that pattern.

In the operation of FIG. 2, when a new_fail signal is set to "1" (i.e., a unique fail occurs) during a repair mode, the new_fail signal is passed through AND gate 210 as long as the current pattern is not at the end of the pattern. Then, the new_fail signal set to "1" is passed through the OR gate 230 such that the fail-status register 240 is set to "1". Then, at the end of the pattern, the output of the AND gate 250 is "1". The output of the AND gate 250 is then negated by NOT gate 260, and the pattern mask register 270 receives a "0", indicating that a unique fail has occurred and that the pattern will not be masked (i.e., unmasked) in the pattern mask register 270. Any pattern that corresponds to a bit in the pattern mask register 270 which is reset to "0" will be run during the subsequent pass-fail mode of MBIST.

In FIG. 2, the MBIST circuit includes a fail status register 240 which receives a new fail signal value in response to a detection of a unique fail in a pattern. Further, the MBIST circuit of FIG. 2 includes a pattern mask register 270 which receives into a bit which corresponds to the present pattern a negation of the new fail signal value in response to the detection of the unique fail in the pattern and coinciding with the end of the pattern being reached. The pattern mask register 270 unmasks a bit corresponding to the pattern in response to receiving the negation of the new fail signal.

Figure 3:
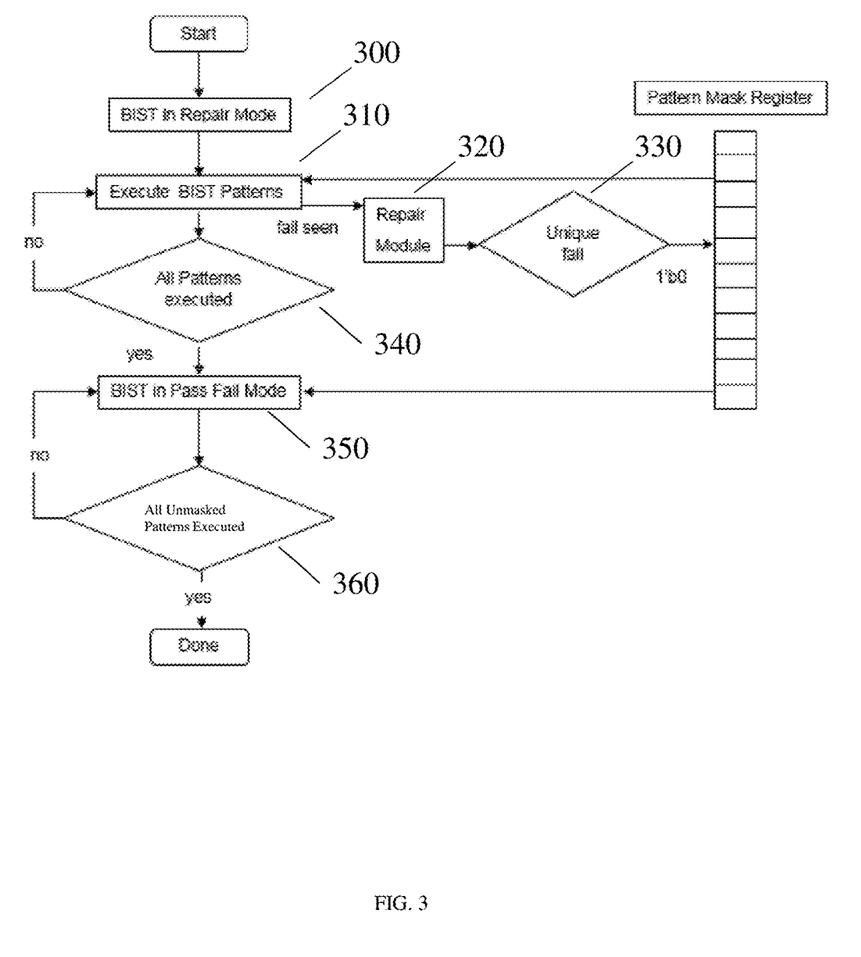
FIG. 3 shows a flow diagram implementing the processes in accordance with aspects of the disclosure.

FIG. 3 shows a flow diagram implementing the processes in accordance with aspects of the disclosure. By way of illustration in FIG. 3, at the end of the MBIST run for repair mode, pattern mask register (as shown in FIG. 2) contains unique fail information on a per pattern basis. Repair logic repairs the memory by replacing the failing cells with the redundant rows or columns and the redundancies are enabled at the end of the repair mode. At the beginning of the pass-fail mode, MBIST runs only those patterns which had unique fails for the patterns, thereby saving the test time of not running those patterns which do not see any fails.

More specifically, at step 300, a BIST engine goes into repair mode. At step 310, the BIST engine begins executing patterns in repair mode. If a failure is seen when executing patterns in repair mode, then a repair module collects failure address information for the failure at step 320.

It is determined whether all patterns have been executed at step 340. If all patterns have been executed in repair mode, the process of the flow diagram continues to step 350. If all patterns have not been executed in repair mode, the process of the flow diagram returns to step 310 and the next pattern is executed by the BIST engine.

Assuming that a failure has been seen in step 310 and the failure address information is collected in step 320 of FIG. 3, there is a determination of whether the failure is a unique fail at step 330. A unique fail is determined if the failure occurs at a combination of a row and column address that has not been seen in previous patterns (i.e., a unique failure is a failure which has to occur at a unique combination of a row and column address). If the failure is determined to be a unique fail at step 330, then at the end of the pattern the corresponding bit in the pattern mask register is set to "0" (i.e., the bit for that pattern is unmasked). Alternatively, if there is either no failure or the failure is not unique, then the corresponding bit in the pattern mask register is set to "1" (i.e., the bit for that pattern is masked).

Once all the MBIST patterns have been run in repair mode, then at step 350, the BIST engine goes into pass fail mode and runs only the patterns which had unique fails. At step 350, the BIST engine only runs those patterns which have unique fails by monitoring which bits in the pattern mask register have been reset to "0", and running only those bits' corresponding patterns. The BIST engine will not run the patterns which correspond to masked bits (i.e., bits in the pattern mask register which have been set to "1"). Finally, at step 360, if the BIST engine runs all of the patterns which have unique fails (i.e., all unmasked patterns are run), the processes in the flow diagram end. Otherwise, if the BIST engine has not run all of the patterns which have unique failures, the process of the flow diagram returns to step 350 and the next pattern with a unique fail is executed by the BIST engine.

In FIG. 3, a method of the present disclosure may include executing a plurality of patterns in at least one memory device, detecting a unique fail in a pattern during execution of the plurality of patterns, and unmasking a bit in a pattern mask register which corresponds with the detected unique fail. Another method of the present disclosure may include executing a first plurality of patterns in at least one memory device to detect a second plurality of patterns which have a unique fail, and executing the second plurality of patterns which have the unique fail. The second plurality of patterns is a subset of the first plurality of patterns.

Figure 4:
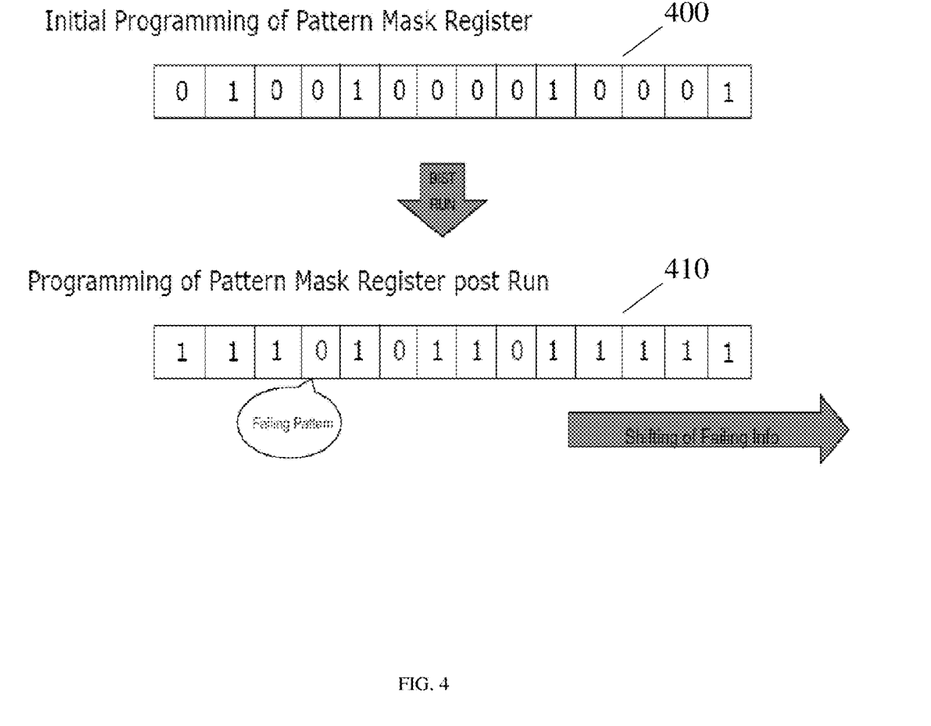
FIG. 4 shows an illustrative, non-limiting example of programming the pattern mask register of FIG. 1 in accordance with aspects of the disclosure.

FIG. 4 shows an illustrative, non-limiting example of programming the pattern mask register of FIG. 1 in accordance with aspects of the disclosure. FIG. 4 shows an example of an initial programming of pattern mask register 400. Then, the BIST engine executes a plurality of patterns in order to program the pattern mask register 410. The programmed pattern mask register 410 will mask bits of the pattern mask register 410 that do not uniquely fail (i.e., bit is set to "1") and will reset bits of the pattern mask register 410 that do uniquely fail (i.e., bit is reset to "0"). Therefore, based on FIG. 4, there are three bits in the pattern mask register 410 which correspond to patterns which have a unique failure (i.e., these three bits in the pattern mask register 410 are reset to "0").

Figure 5:
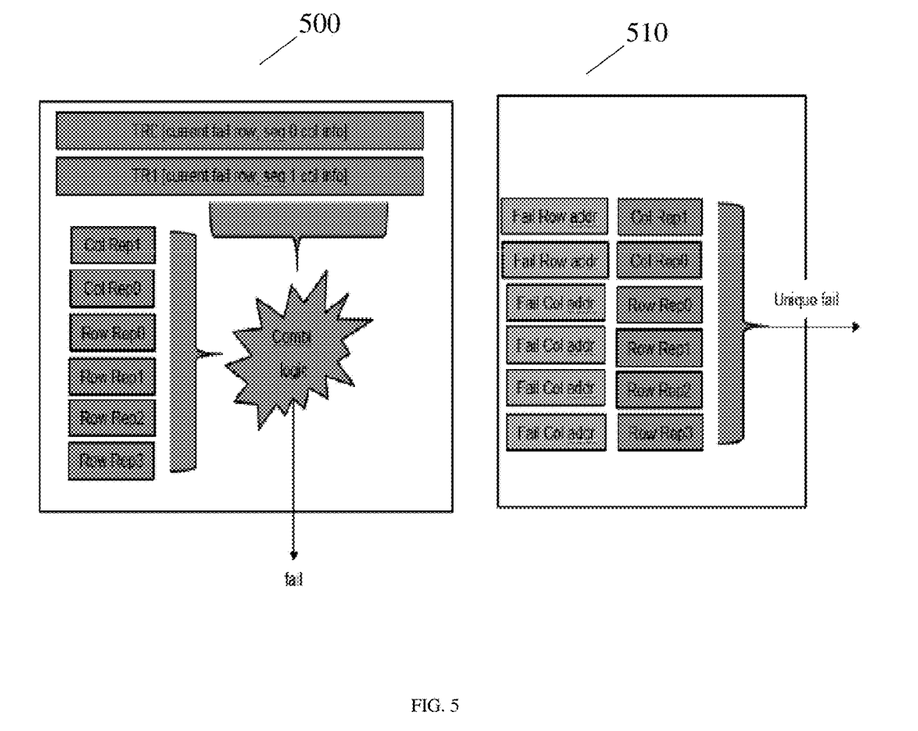
FIG. 5 shows schematics of fail identification logic to generate fail identification in accordance with aspects of the disclosure.

FIG. 5 shows schematics of fail identification logic to generate fail identification in accordance with aspects of the disclosure. In FIG. 5, fail identification logic 500 in a known system includes a plurality of registers (fail column address registers, fail row address registers, and temporary registers). The temporary registers will temporarily store two failing row and column combinations until the repair analysis logic can determine how best to implement a repair (i.e., whether it is best to use a row repair or a column repair). Further, the temporary registers store data until a repair occurs, and then the data in the temporary registers gets wiped out. The permanent storage of a row repair will store only the failing row information, and the permanent storage of a column repair will store only the failing column information. In the fail identification logic 500 of FIG. 5, the failing row and column information for a single fail is not permanently stored. In FIG. 5, the fail identification logic 500 is used to store all of the patterns that have failed.

In FIG. 5, in the present disclosure being described, unique fail identification logic 510 includes a plurality of registers (i.e., fail row address registers, fail column address registers, column repair registers, and row repair registers). Further, the unique fail identification logic 510 permanently stores a complete repair address (i.e., both a row address and a column address). This enables the BIST logic to determine if a current failing bit cell has been already found in a previous pattern (i.e., is this a unique fail). Thus, the unique fail identification logic 510 is an improvement over previous fail identification logic (e.g., fail identification logic 500), which only permanently stores one of a row or column address. Further, the unique fail identification logic 510 stores only unique failures, instead of all failures.

The unique fail identification logic 510 stores both the row address and the column address because a unique fail is defined by a unique combination of failing row address and failing column address. Further, in embodiments, the failing row repair address registers and the failing column repair address registers of the unique fail identification logic 510 may be stored in fuses. Thus, the unique fail identification logic 510 in FIG. 5 will store a complete failing address in order to determine if a unique fail occurs. Then, after determining whether a unique fail occurs, only those patterns which have a unique fail during a given repair mode MBIST operation will need to be run in the corresponding pass-fail mode MBIST operation. Thus, test time is saved when multiple BIST runs are executed. One of ordinary skill in the art would understand that multiple BIST runs may need to be executed to test memory over different temperature, voltage levels, processes, etc. Further, the unique fail in FIG. 5 (i.e., new_fail signal) is used to update the pattern mask register 270 in FIG. 2.

In the present disclosure, prior to the BIST engine being run in pass fail mode, the bits of the pattern mask register are programmed in order to select which patterns would be masked (i.e., a bit in pattern mask register is set to "1") and which patterns would be run (i.e., a bit in pattern mask register is unmasked and set to "0"). For example, it may be advantageous, for a variety of reasons, to only run a subset of patterns during the repair mode MBIST operation for certain test conditions defined by a certain frequency, temperature and voltage. As discussed above, during the repair mode MBIST operation, patterns for the subsequent pass fail mode of MBIST are masked if the pattern, during the repair mode MBIST operation, does not fail or does not exhibit a unique failure. In this way, when patterns are run by the BIST engine in repair mode MBIST operation, only those patterns which have a unique failure (i.e., a different combination of a column address and a row address) would be executed during the subsequent pass fail mode MBIST operation. Thus, test time is saved and there is no need for a tester to analyze failures in the executed patterns. In other words, during the repair mode MBIST operation, the pattern mask register within the BIST engine will automatically be incrementally programmed for the subsequent pass fail mode MBIST operation, without requiring tester interaction.

As should now be understood by one of ordinary skill in the art, the collected information can help in faster debug/verification. For example, in known systems in order to determine whether patterns had uniquely failed, it would be necessary to execute all of the patterns and then examine the failure to determine if a new location (i.e., a different combination of a column address and a row address) has failed (as opposed to a failure from a previously known location). Therefore, it is possible to speed up the debug process during initial hardware start up. By only running patterns which correspond to a unique fail, it is possible to more quickly isolate problem areas in the memory design, with more precise targeting in order to isolate possible root causes.

The structure and methods as described above are used in integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory built-in self-test (MBIST) circuit, comprising:
   a unique identification logic comprising fail row address registers, fail column address registers, column repair registers, temporary registers and row repair registers and configured to determine whether a unique fail in a memory pattern occurs in a memory device based on a comparison to previous memory patterns in the memory device, the unique identification logic stores a repair address comprising a row address and a column address of the memory pattern corresponding to the unique fail for storing unique fails instead of all fails and outputs a new fail signal having a new fail signal value in response to the unique fail occurring in the memory pattern;
   a repair module which repairs the memory pattern with the unique fail;
   a fail status register which receives the new fail signal value from the unique identification logic in response to determining that the unique fail in the memory pattern occurs; and
   a pattern mask register which stores a bit with a different value of the new fail signal value representative of the unique fail in the memory pattern, the pattern mask register being automatically incrementally programmed for a subsequent pass fail mode without tester interaction,
   wherein the unique fail in the memory pattern is a failure in a different combination of the row address and the column address than previous failures, and the fail status register resets to a value of 0 prior to executing a next memory pattern.

2. The MBIST circuit of claim 1, wherein the different value of the new fail signal is an unmasked bit.

3. The MBIST circuit of claim 2, wherein the pattern mask register receives the different value of the new fail signal value during a repair mode.

4. The MBIST circuit of claim 2, further comprising a BIST engine which executes the memory pattern corresponding to the unmasked bit during a subsequent pass fail mode.

5. The MBIST circuit of claim 2, wherein the value of the unmasked bit is "0", and a value of the new fail signal value is "1".

6. The MBIST circuit of claim 1, wherein the pattern mask register masks a bit which does not have the unique fail.

7. The MBIST circuit of claim 6, wherein the value of the masked bit is "1".

8. The MBIST circuit of claim 6, further comprising a BIST engine which skips execution of the memory pattern corresponding to the bit which is masked during a subsequent pass fail mode.

9. The MBIST circuit of claim 1, further comprising a NOT gate which inverts the new fail signal value to the different value of the new fail signal value.

10. A method, comprising:
    executing a plurality of memory patterns in at least one memory device;
    detecting a unique fail in a memory pattern during execution of the plurality of memory patterns based on a comparison to previous memory patterns;
    repairing the memory pattern with the detected unique fail during a repair mode by replacing failing cells in the memory pattern with redundant rows or columns, wherein the redundancies are enabled at an end of the repair mode;
    determining fail information indicating the unique fail is a new fail or a fail fixed by previously run patterns;
    storing a row address and a column address of the memory pattern corresponding to the unique fail;
    outputting a new fail signal value in response to the unique fail occurring in the memory pattern;
    changing a bit value in a pattern mask register which corresponds with the detected unique fail; and
    identifying statistics of failing patterns to characterize memories,
    wherein the unique fail in the memory pattern is a failure in a different combination of the row address and the column address than previous failures.

11. The method of claim 10, wherein the changed bit value is an unmasked bit which is set to a value of "0".

12. The method of claim 11, further comprising executing the memory pattern corresponding to the unmasked bit during a subsequent pass fail mode.

13. The method of claim 10, further comprising masking a bit value which does not have the unique fail.

14. The method of claim 13, wherein the masked bit value which does not have the unique fail is set to a value of "1".

15. The method of claim 13, further comprising skipping execution of the memory pattern which corresponds with the masked bit during a subsequent pass fail mode.

16. The method of claim 10, wherein the executing the plurality of memory patterns in the at least one memory device occurs in a memory built-in self-test (MBIST) circuit.

17. A method comprising:
executing a first plurality of memory patterns which are a subset of patterns in at least one memory device during a repair mode under test conditions defined by a frequency, a temperature and a voltage of the at least one memory device to detect a second plurality of memory patterns which have a unique fail based on a comparison to previous memory patterns;
repairing the second plurality of memory patterns which have the unique fail during a repair mode by replacing failing cells in the second plurality of memory patterns with redundant rows or columns, wherein the redundancies are enabled at the end of the repair mode,
determining fail information indicating the unique fail is a new fail or a fail fixed by previously run patterns;
automatically program incrementally a pattern mask register which stores bits representative of the unique fail for a subsequent pass fail mode;
storing a row address and a column address of each of the second plurality of memory patterns corresponding to the unique fail;
outputting a new fail signal value in response to the unique fail occurring in the second plurality of memory patterns;
executing the second plurality of memory patterns which have the unique fail;
determining that every pattern in the first plurality of memory patterns and the second plurality of memory patterns have been run in the repair mode;
in response to the determination, executing the second plurality of memory patterns in a pass fail mode; and
identifying statistics of failing patterns to characterize memories,
wherein the second plurality of memory patterns is a subset of the first plurality of memory patterns, and the unique fail in the second plurality of memory patterns is a failure in a different combination of the row address and the column address than previous failures.

18. The method of claim 17, wherein the executing the second plurality of memory patterns occurs in a pass fail mode.

19. The MBIST circuit of claim 1, wherein the pattern mask register stores a plurality of bits which correspond to a plurality of memory patterns including a checkerboard pattern, a blanket pattern, and a word-line-stripe pattern, the unique fail identification logic stores both the row address and the column address in a corresponding failure row repair address register and a corresponding failure column repair address register.

20. The MBIST circuit of claim 19, further comprising:
at least one AND gate which receives the new fail signal, wherein the new fail signal value is set to 1,
an OR gate directly connected to an output of the at least one AND gate, the new fail signal passing through the OR gate to the fail status register which sets the fail status register to 1,
a second AND gate directly connected to the at least one AND gate and fail status register and having an output at 1 at the end of the pattern;
a NOT gate directly connected to the second AND gate and negates the output of the second AND gate such that the pattern mask register receives a value of 0 indicating that the unique fail has occurred and that the current memory pattern will be unmasked in the pattern mask register, wherein the failure row repair address register and the failure column repair address register are stored in fuses.

* * * * *